(12) United States Patent
Wang et al.

(10) Patent No.: US 6,326,849 B1
(45) Date of Patent: Dec. 4, 2001

(54) ISOLATION CIRCUIT FOR USE IN RF AMPLIFIER BIAS CIRCUIT

(75) Inventors: Nanlei Larry Wang, Palo Alto; Shuo-Yuan Hsiao, Milpitas; Wei-Shu Zhou, Fremont; Shihui Xu, San Jose, all of CA (US)

(73) Assignee: EiC Corporation, Fremont, CA (US)

( * ) Notice: Subject to any disclaimer, the term of this patent is extended or adjusted under 35 U.S.C. 154(b) by 0 days.

(21) Appl. No.: 09/672,387

(22) Filed: Sep. 28, 2000

(51) Int. Cl.[7] .................................................. H03F 3/04
(52) U.S. Cl. .......................... 330/310; 330/133; 330/285; 330/302
(58) Field of Search .................................. 330/133, 134, 330/285, 302, 310

(56) References Cited

U.S. PATENT DOCUMENTS

| | | | |
|---|---|---|---|
| 5,532,646 | * 7/1996 | Aihara | 330/279 |
| 5,726,606 | * 3/1998 | Marland | 330/302 |
| 5,942,946 | * 8/1999 | Su et al. | 330/310 |
| 5,994,964 | * 11/1999 | Tanemura | 330/285 |
| 6,052,029 | * 4/2000 | Uda et al. | 330/277 |
| 6,188,283 | * 2/2001 | Hagio et al. | 330/285 |

* cited by examiner

*Primary Examiner*—Robert Pascal
*Assistant Examiner*—Henry Choe
(74) *Attorney, Agent, or Firm*—Townsend and Townsend and Crew LLP; Henry K. Woodward

(57) ABSTRACT

In an RF amplifier circuit having a plurality of transistor stages with each transistor having an input terminal for receiving an RF signal, a bias circuit is provided for applying a DC bias to the input terminal of a transistor. An isolation circuit connects a DC power supply to a bias circuit whereby DC voltage from the power terminal is applied to the bias circuit and RF signal from the transistor input terminal is attenuated. The isolation circuit includes a reactive serial path which allows the flow of DC current and presents an impedance to RF current flow and a reactive shunt path to ground which can comprise a capacitor or a serial inductor/capacitor circuit. The reactive serial path can comprise an inductor or an inductor/capacitor parallel circuit.

6 Claims, 2 Drawing Sheets

ISOLATION CIRCUIT FOR USE IN RF AMPLIFIER BIAS CIRCUIT

BACKGROUND OF THE INVENTION

This invention relates generally to RF and microwave signal amplifiers, and more particularly the invention relates to isolation and bias circuits for use in such amplifiers.

FIG. 1 illustrates a conventional multi-stage RF amplifier including bipolar transistors 10, 12 which are driven respectively by an input matching network 14 and an interstage matching network 16 with an output impedance matching network 18 at output transistor 12. FETs can be used in the circuit, and additional transistor stages can be provided between transistor 10, 12, but a two-stage amplifier is shown for simplicity. A DC bias voltage is coupled to the base inputs of transistors 10, 12 by bias circuits 20, 22 which are coupled to transistor 10, 12, respectively through choke coils 24, 26. DC power is connected to the bias circuits along with a power down signal applied to pins 28, 30 of the bias circuits.

FIG. 2 is a schematic of bias circuit 20 which includes transistors 32, 34 with power down pin 28 connected through a resistor 36 to the base of transistor 34 and collector transistor 32, and with the DC power pin 30 connected to the collector of transistor 34. The emitter of transistor 32 is grounded, while the base of transistor 32 and emitter of transistor 34 are coupled through choke coil 24 to the base of transistor 10. The RF signal is connected to the base of transistor through pin 38. A capacitor 40 connects coil 24 to ground.

A large RF choke has a high inductance and often a high resistance value. Further, a large capacitance value is often not feasible, especially in MMIC/RFIC circuits where chip area must be minimized. Consequently, the choke may not provide enough insulation of the RF signal from entering the bias circuit and the power supply. Thus, the DC power supply path to the bias circuit can become an RF leakage path and an undesirable RF feedback loop.

The present invention is directed to reducing the undesired RF leakage in a feedback loop through the DC power supply.

SUMMARY OF THE INVENTION

In accordance with the invention, an isolation circuit is included in the bias circuitry for an RF transistor stage to reduce RF signal leakage from the transistor in a feedback loop through the bias circuit and power supply. The isolation circuit allows DC current to flow into the bias circuit but presents an impedance to RF signals. Thus, the serial path of the isolation circuit can comprise an inductor or a parallel inductive-capacitive circuit resonating at the operating RF frequency. A shunt capacitor or a shunt inductive-capacitive series circuit provides a low impedance path to ground for RF signals. A multi-section isolation circuit can be used.

The isolation circuit reduces the RF leakage and feedback, thereby resulting in a more stable amplifier operation against temperature and frequency. Further, more stable gain and linearity along with improved frequency response are realized over temperature with the isolation circuit.

The invention and objects and features thereof will be more readily apparent from the following detailed description and appended claims when taken with the drawings.

BRIEF DESCRIPTION OF THE DRAWINGS

Like elements in the several figures have the same reference numerals.

DESCRIPTION OF ILLUSTRATED EMBODIMENT

Figure 1:
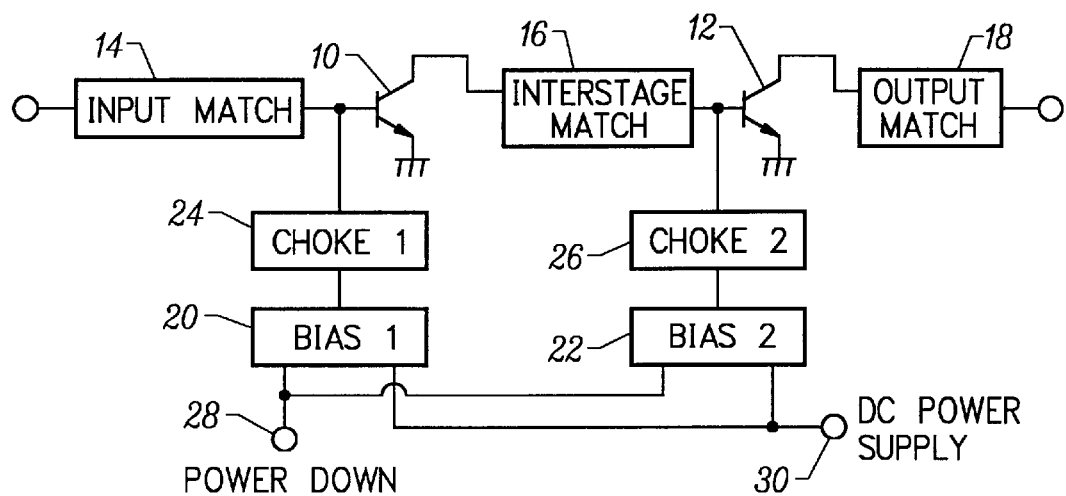
FIG. 1 is a schematic of a conventional multi-stage RF amplifier including bias circuits connected to the transistor stages.
Figure 2:
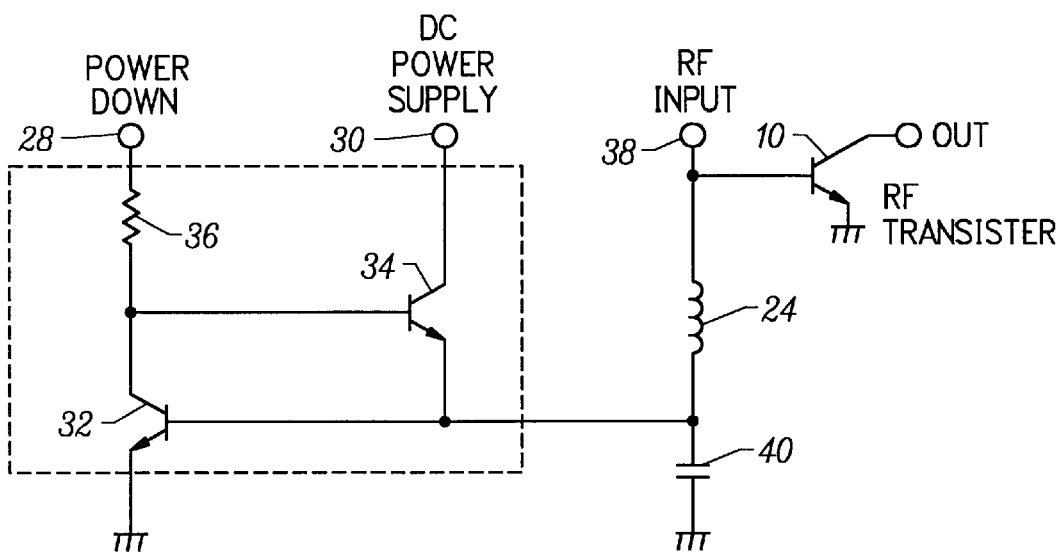
FIG. 2 is a schematic of a conventional bias circuit as used in the amplifier FIG. 1.
Figure 3:
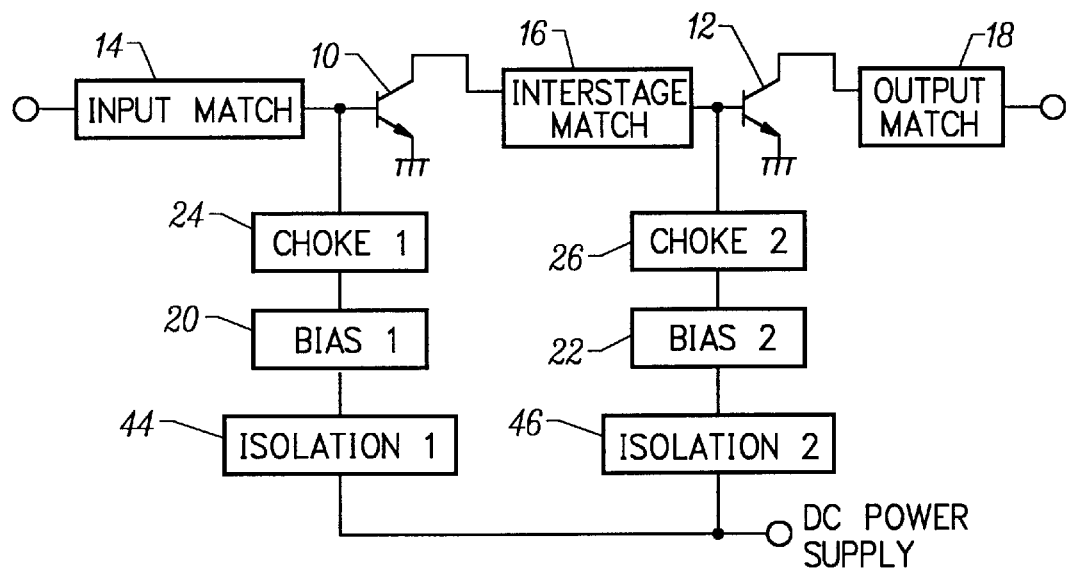
FIG. 3 is a schematic of a multi-stage RF amplifier in accordance with the present invention.

FIG. 3 is a modification of the circuitry of FIG. 1 in accordance with one embodiment of the invention. Like elements have the same reference numerals. In accordance with the invention, the DC power supply is applied to bias circuit 20 and bias circuit 22 through isolation circuits 44 and 46 which provide impedances to RF signal flowing from transistors 10, 12 through the bias circuitry back to the power supply. Each isolation circuit needs to allow DC current to flow into the bias circuit from the power supply. Thus, a serial path through the isolation circuit can be an inductor or an inductive-capacitive parallel circuit resonating at the operating frequency. A shunt capacitor or a shunt inductive-capacitive serial circuit provides a low impedance node to ground along the DC path.

Figure 4A:
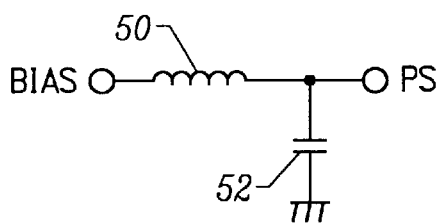
FIGS. 4A–4D are schematics of isolation circuits which can be used in the amplifier of FIG. 3.

FIGS. 4A–4D are schematics illustrating several embodiments of a suitable isolation circuit. In FIG. 4A, inductor 50 serially connects the power supply (PS) to the bias circuit (BIAS) with capacitor 52 providing a shunt circuit for RF signals to ground.

Figure 4B:
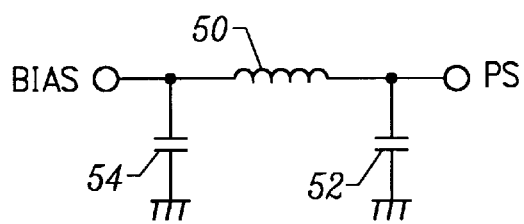
Figure 4C:
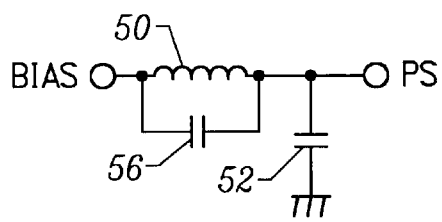
Figure 4D:
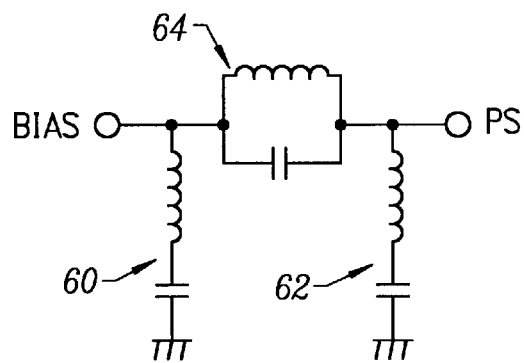

In FIG. 4B, two capacitors 52, 54 are provided as RF shunt paths at either end of inductor 50. In FIG. 4C, inductor 50 is connected in parallel with capacitor 56 to form a high impedance resonant circuit at the operating RF signal frequency and with shunt capacitor 52 again connected to circuit ground. A multi-section isolation circuit can be used such as the three section isolation circuit shown in FIG. 4D. In this circuit, series inductive-capacitive circuits 60, 62 provide low impedance shunt circuits for RF signals while parallel inductive-capacitive circuit 64 presents a high impedance at the resonant frequency of the RF signal.

Use of isolation circuits in RF and microwave amplifiers in accordance with the invention reduces the RF signal leakage through a power supply feedback loop thus resulting in a more stable operation and more stable gain and linearity versus temperature and frequency.

While the invention has been described with reference to specific embodiments, the description is illustrative of the invention and is not to be construed as limiting the invention. Various modifications and applications may occur to those skilled in the art without departing from the true spirit and scope of the invention as defined by the appended claims.

What is claimed is:

1. For use in an RF amplifier having a plurality of transistor stages, a circuit for applying a DC bias voltage to the input terminal of one of the transistors comprising:

a) a power terminal for receiving a DC voltage, b) a bias circuit connected to the input terminal of the transistor, and c) an isolation circuit for connecting the power terminal to the bias circuit whereby DC voltage from the power terminal is applied to the bias circuit and RF signal from the transistor input terminal is attenuated, the isolation circuit including a reactive serial path which allows the flow of a DC current and presents an impedance to RF current flow wherein the reactive serial path comprises an inductor/capacitor parallel circuit.

2. For use in an RF amplifier having a plurality of transistor stages, a circuit for applying a DC bias voltage to the input terminal of one of the transistors comprising:

a) a power terminal for receiving a DC voltage, b) a bias circuit connected to the input terminal of the transistor, and c) an isolation circuit for connecting the power terminal to the bias circuit whereby DC voltage from the power terminal is applied to the bias circuit and RF signal from the transistor input terminal is attenuated, the isolation circuit including a reactive serial path which allows the flow of a DC current and presents an impedance to RF current flow, and a reactive shunt path to ground comprising two capacitors connected to opposing ends of the reactive serial path.

3. For use in an RF amplifier having a plurality of transistor stages, a circuit for applying a DC bias voltage to the input terminal of one of the transistors comprising:

a) a power terminal for receiving a DC voltage, b) a bias circuit connected to the input terminal of the transistor, and c) an isolation circuit for connecting the power terminal to the bias circuit whereby DC voltage from the power terminal is applied to the bias circuit and RF signal from the transistor input terminal is attenuated, the isolation circuit including a reactive serial path which allows the flow of a DC current and presents an impedance to RF current flow and a reactive shunt path to ground comprising two serial inductor/capacitor circuits connected to opposing ends of the reactive serial path.

4. An RF amplifier circuit comprising:

a) a plurality of transistors serially coupled to receive RF signals at an input terminal of each transistor, b) a plurality of bias circuits each connected to an input terminal of a transistor for applying a DC bias voltage, c) a DC power terminal, and d) a plurality of isolation circuits each connecting the DC power terminal to a bias circuit, whereby DC voltage from the power terminal is applied to the bias circuit and RF signal from a transistor input terminal is attenuated, each isolation circuit including a reactive serial path which allows the flow of DC current and presents an impedance to RF current flow wherein the reactive serial path comprises an inductor/capacitor parallel circuit.

5. An RF amplifier circuit comprising:

a) a plurality of transistors serially coupled to receive RF signals at an input terminal of each transistor, b) a plurality of bias circuits each connected to an input terminal of a transistor for applying a DC bias voltage, c) a DC power terminal, and d) a plurality of isolation circuits each connecting the DC power terminal to a bias circuit, whereby DC voltage from the power terminal is applied to the bias circuit and RF signal from a transistor input terminal is attenuated, wherein each isolation circuit includes a reactive serial path which allows the flow of DC current and presents an impedance to RF current flow and a reactive shunt path to ground, wherein the reactive shunt path comprises two capacitors connected to opposing ends of the reactive serial path.

6. An RF amplifier circuit comprising:

a) a plurality of transistors serially coupled to receive RF signals at an input terminal of each transistor, b) a plurality of bias circuits each connected to an input terminal of a transistor for applying a DC bias voltage, c) a DC power terminal, and d) a plurality of isolation circuits each connecting the DC power terminal to a bias circuit, whereby DC voltage from the power terminal is applied to the bias circuit and RF signal from a transistor input terminal is attenuated, wherein each isolation circuit includes a reactive serial path which allows the flow of DC current and presents an impedance to RF current flow and a reactive shunt path to ground, wherein the reactive shunt path comprises two serial inductor/capacitor circuits connected to opposing ends of the reactive serial path.

* * * * *